(12) United States Patent  (10) Patent No.: US 8,000,080 B2
Krause et al.  (45) Date of Patent: Aug. 16, 2011

(54) PARTICLE TRAP

(75) Inventors: Stephen E. Krause, Ipswich, MA (US);
Russell J. Low, Rowley, MA (US);
Kasegn D. Tekletsadik, Rexford, NY (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 221 days.

(21) Appl. No.: 12/327,888

(22) Filed: Dec. 4, 2008

(65) Prior Publication Data

US 2009/0147435 A1 Jun. 11, 2009

Related U.S. Application Data

(60) Provisional application No. 61/012,237, filed on Dec. 7, 2007.

(51) Int. Cl.
*H01T 23/00* (2006.01)
*H01P 1/10* (2006.01)
*H01H 47/00* (2006.01)

(52) U.S. Cl. ........................... 361/233; 361/236
(58) Field of Classification Search .............. 361/233, 361/236
See application file for complete search history.

(56) References Cited

U.S. PATENT DOCUMENTS

| 3,237,382 | A | * | 3/1966 | Berly ................................. 96/67 |
| 3,515,939 | A | | 6/1970 | Trump |
| 4,327,243 | A | | 4/1982 | Hopkins et al. |
| 5,279,723 | A | | 1/1994 | Falabella et al. |
| 5,656,092 | A | | 8/1997 | Blake et al. |
| 6,307,172 | B1 | | 10/2001 | Bolin et al. |
| 6,451,176 | B1 | | 9/2002 | Vernon et al. |
| 7,262,362 | B2 | | 8/2007 | Holaus et al. |
| 7,547,898 | B2 | | 6/2009 | Berrian et al. |
| 7,547,899 | B2 | * | 6/2009 | Vanderpot et al. ....... 250/492.21 |
| 7,566,887 | B2 | | 7/2009 | Huang et al. |
| 7,598,495 | B2 | | 10/2009 | Kellerman et al. |
| 2007/0102652 | A1 | | 5/2007 | Ring et al. |

FOREIGN PATENT DOCUMENTS

WO  2005096099 A2  10/2005

* cited by examiner

*Primary Examiner* — Jared Fureman
*Assistant Examiner* — Lucy Thomas

(57) ABSTRACT

An apparatus and method for trapping particles in a housing is disclosed. A high voltage terminal/structure is situated within a housing. A conductive material, having a plurality of holes, such as a mesh, is disposed a distance away from an interior surface of the housing, such as the floor of the housing, forming a particle trap. The conductive mesh is biased so that the electrical field within the trap is either non-existent or pushing toward the floor, so as to retain particles within the trap. Additionally, a particle mover, such as a fan or mechanical vibration device, can be used to urge particles into the openings in the mesh. Furthermore, a conditioning phase may be used prior to operating the high voltage terminal, whereby a voltage is applied to the conductive mesh so as to attract particles toward the particle trap.

24 Claims, 8 Drawing Sheets

PARTICLE TRAP

This application claims priority of U.S. Provisional Patent Application Ser. No. 61/012,237, filed Dec. 7, 2007, the disclosure of which is hereby incorporated by reference.

FIELD

This disclosure relates to particle traps, and more particularly to a particle trap for an ion implanter.

BACKGROUND

An ion implanter is used to generate and direct ions towards a workpiece. A desired impurity material may be ionized in an ion source, the ions may be accelerated to form an ion beam of prescribed energy, and the ion beam may be directed at a front surface of the workpiece. In one application, the workpiece may be a semiconductor wafer where the energetic ions are embedded into the crystalline lattice of the semiconductor material of the wafer. The ion beam may be distributed over the wafer area by beam movement, by wafer movement, or by a combination of beam and wafer movement.

An ion implanter may have a terminal structure. The terminal structure may sometimes be referred to in the art as a "terminal" or "high voltage terminal" and is fabricated of conductive material such as metal. The terminal structure may have varying geometries that define a terminal shape. The ion source is contained within the terminal structure. The terminal structure may be energized to a terminal voltage to increase the acceleration of the ions from the ion source. The terminal structure, as well as other components and subsystems of the ion implanter, are disposed within a grounded enclosure. Thus, the grounded housing protects personnel from high voltage dangers when the ion implanter is running.

As the terminal structure is energized, the presence of excessive amounts of particles and/or contaminants, about the terminal structure can adversely affect operational reliability of the ion implanter. These particles can include, but not be limited to, dirt, dust, debris and other types of particles such as metallic and non-metallic particles. For instance, random failures and voltage breakdowns may occur at less than desired terminal voltage levels.

Accordingly, there is a need in the art for an ion implanter having a particle trap to overcome the above-described inadequacies and shortcomings.

SUMMARY

The shortcomings of the prior art are overcome by the apparatus and method of the present disclosure. A high voltage terminal is situated within a housing/enclosure. A conductive material having a plurality of holes, such as a mesh, is disposed a distance away from an interior surface of the housing, such as the floor of the housing, forming a particle trap. The conductive mesh can be grounded in one embodiment, where the field created by the terminal voltage within the trap is negligible, allowing particles to fall into the trap. In another embodiment, the conductive mesh is biased so that the electrical field within the trap is either non-existent or pushing toward the floor, so as to retain particles within the trap. Additionally, a particle mover, such as a fan or mechanical vibration device, can be used to urge particles into the openings in the mesh. Furthermore, a conditioning phase may be used prior to operating the high voltage terminal, whereby a voltage is applied to the conductive mesh, while no voltage is applied to the terminal, so as to attract particles toward the mesh. In another embodiment, surface treatments can be applied to the terminal surfaces, and/or the ground surfaces to create areas where the electrostatic field is low, creating less attractive force on the particle.

BRIEF DESCRIPTION OF THE DRAWINGS

For a better understanding of the present disclosure, reference is made to the accompanying drawings, in which like elements are referenced with like numerals, and in which.

DETAILED DESCRIPTION

This disclosure is described herein in connection with an ion implanter. However, this disclosure can be used with other apparatus having high voltage components where particles may adversely affect the performance of the apparatus. Thus, the disclosure is not limited to the specific embodiments described below.

Figure 1:
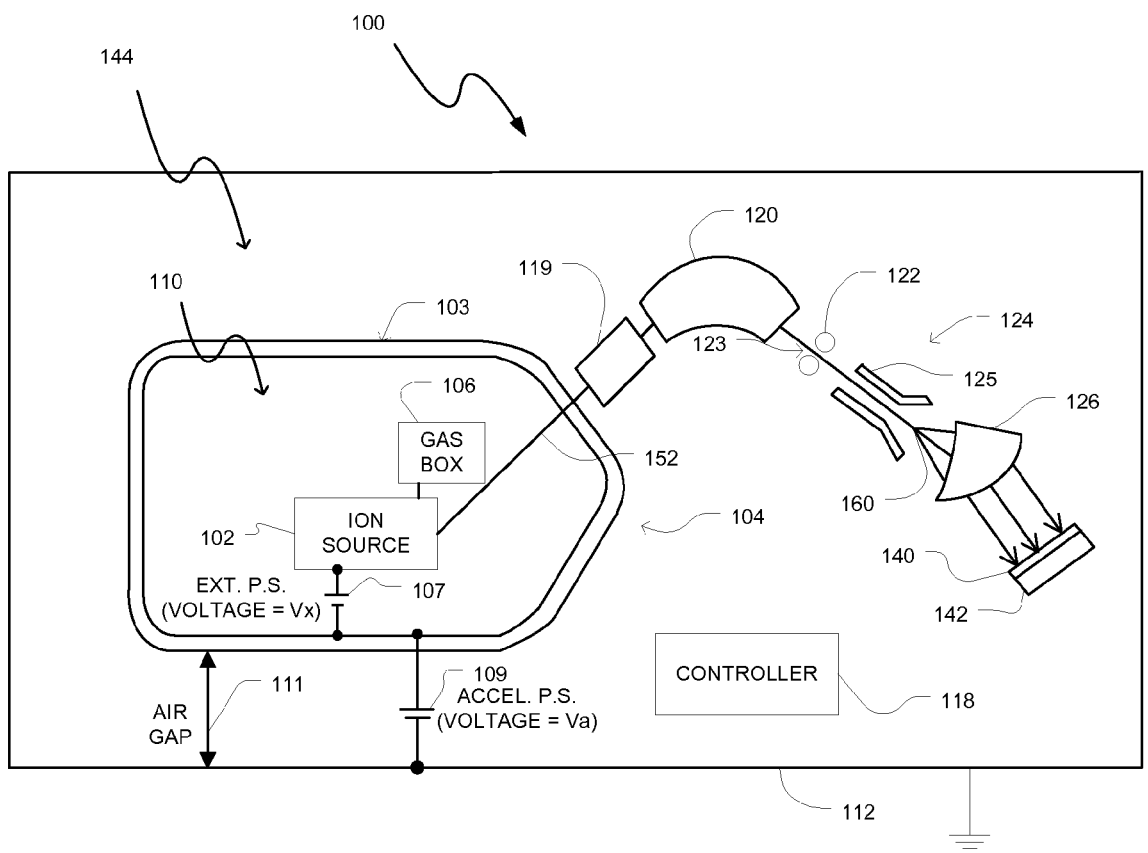
FIG. 1 is a plan view of a block diagram of an ion implanter.

Turning to FIG. 1, a block diagram of an ion implanter 100 including a particle trap consistent with this disclosure is illustrated. The ion implanter 100 is but one example of an ion implanter and those skilled in the art will recognize other ion implanters that may include a particle trap consistent with this disclosure. The ion implanter 100 includes a housing 112 defining a housing cavity, or air gap 144. The housing 112 may also be referred to as an enclosure and is typically grounded. Disposed within the housing cavity 144 is a terminal structure 104 which may sometimes be referred to in the art as a "terminal" or a "high voltage terminal."

The ion implanter 100 may also include an ion source 102, a gas box 106, an acceleration column 119, a mass analyzer 120, a aperture 122 having a mass slit 123, a scanning system 124, an angle corrector 126 and a controller 118. The ion source 102 is configured to provide an ion beam 152. The ion source 102 may include an arc chamber that, in one instance, accepts gas from the gas box 106. The gas box 106 may provide a source of gas to be ionized to the arc chamber. Another source of gas to be ionized may be provided by a vaporizer that is configured to vaporize a solid dopant material. In addition, the ion source 102 may include arc, filament, and bias power supplies necessary for operating the ion source 102. The construction and operation of ion sources and the gas box are well known to those skilled in the art.

The acceleration column 119 accelerates the ion beam 152. The mass analyzer 120 deflects ions so that ions of a desired species pass through the mass slit 123 of the aperture 122 and undesired species do not pass through the mass slit 123. The mass analyzer 120 may deflect ions of the desired species by 90 degrees and deflect ions of undesired species by differing amounts due to their different masses. A scanning system 124 positioned downstream from the mass slit 123 may include scanning electrodes 125 for scanning the ion beam 152 to produce a scanned ion beam having ion trajectories which diverge from a scan origin 160.

An angle corrector 126, such as an angle corrector magnet in one embodiment, deflects ions of the desired ion species to convert diverging ion beam paths to nearly collimated ion beam paths having substantial parallel ion trajectories. In one embodiment, the angle corrector 126 may deflect ions of the desired ion species by 45 degrees.

An end station may support one or more workpieces in the path of the ion beam 152 such that ions of the desired species strike the workpiece 140. The workpiece 140 may be supported by a platen 142. The end station 128 may include other components and sub-systems known in the art such as a workpiece handling system to physically move the workpiece 140 to and from the platen 142 from various holding areas. When the wafer handling system moves the workpiece 140 to the platen 142 from a holding area, the workpiece 140 may be clamped to the platen 142 using known techniques, e.g., electrostatic wafer clamping where the wafer is clamped to the platen with electrostatic forces. The end station may also include a mechanical scanning system to drive the workpiece 140 in a desired fashion.

The controller 118 may receive input data from components of the ion implanter 100 and control the same. For clarity of illustration, input/output paths from the controller 118 to components of the ion implanter 100 are not illustrated in FIG. 1. The controller 118 can be or include a general-purpose computer or network of general-purpose computers that may be programmed to perform desired input/output functions. The controller 118 can also include other electronic circuitry or components, such as application specific integrated circuits, other hardwired or programmable electronic devices, discrete element circuits, etc. The controller 118 may also include user interface devices such as touch screens, user pointing devices, displays, printers, etc. to allow a user to input commands and/or data and/or to monitor the ion implanter 100. The controller 118 may also include communication devices and data storage devices.

The ion beam 152 provided to a surface of the workpiece 140 may be a scanned ion beam. Other ion implantation systems may provide a spot beam or a ribbon beam. The spot beam in one instance may have an approximately circular cross-section of a particular size depending on the characteristics of the spot beam. The ribbon beam may have a large width/height aspect ratio and may be at least as wide as the workpiece 140. The scanner 124 would not be required for systems using a ribbon beam or a stationary spot beam. The workpiece 140 can take various physical shapes such as a common disk shape. In one instance, the workpiece 140 can be a semiconductor wafer fabricated from any type of semiconductor material such as silicon.

The ion source 102 may be positioned within the terminal cavity 110 defined by the terminal structure 104. An extraction power supply 107 may be coupled to the ion source 102. The extraction power supply 107 may provide a voltage level (Vx) to accelerate and extract ions from the ion source 102. In one embodiment, the extraction power supply may provide a voltage (Vx) in the range of 20 kV to 120 kV.

An acceleration power supply 109 may be coupled between the terminal structure 104 and the grounded housing 112 so as to bias the terminal structure 104 at a positive voltage (Va) with respect to ground. In one embodiment, the acceleration power supply 109 may provide an additional voltage level (Va) that may have a maximum voltage in the range of 200 kV to 1,000 kV. Accordingly, the terminal structure 104 may be energized, in some instances, to a high voltage between 200 kV and 1,000 kV. In other instances, the terminal structure 104 may not be energized at all or energized to only nominal values, depending on the desired energy of the ion beam 152. Although only one acceleration power supply 109 is illustrated for clarity of illustration, two or more power supplies may be utilized to provide the desired maximum high voltage level (Va).

During operation of the ion implanter 100, the terminal structure 104 may be energized to high voltage levels depending on the desired energy level of the ion beam 152. Particles including, but not be limited to, dirt, dust, debris and other types of particles such as metallic and non-metallic particles may be present on the terminal surface, within the air gap 111, or in the terminal cavity 110. The presence of such particles can cause voltage breakdown within the terminal structure 104 thus degrading the energy performance range of the ion implanter 100.

Figure 2:
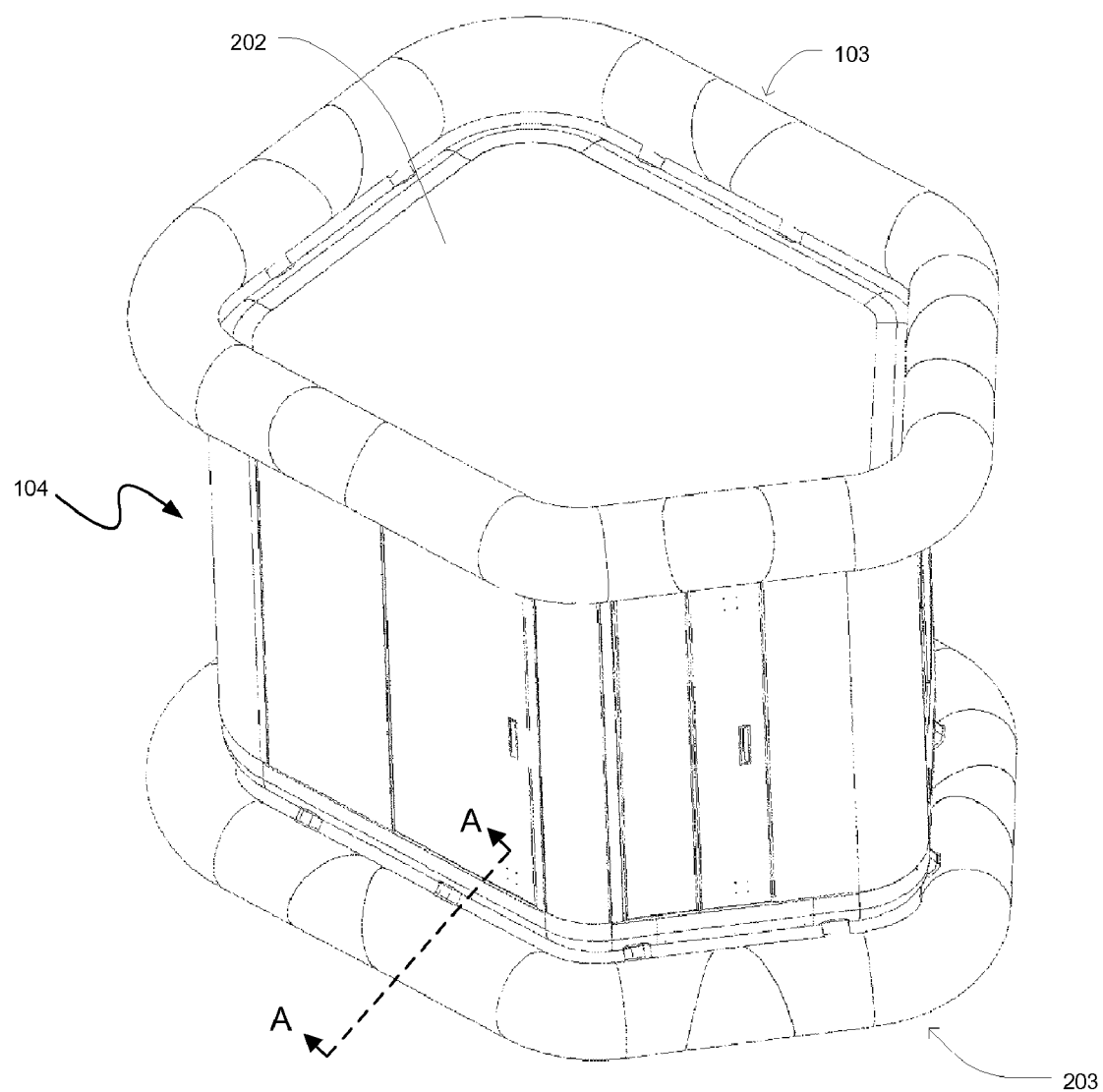
FIG. 2 is a perspective view of the terminal structure of FIG. 1.

Turning to FIG. 2, a perspective view of the terminal structure 104 of FIG. 1 is illustrated. The terminal structure 104 may include a base, one or more upstanding sidewalls coupled to the base, and a top or ceiling 202 coupled to the one or more upstanding sidewalls. Although illustrated as a solid piece, the top 202, the base or the sidewalls of the terminal structure may also be fabricated of a plurality of spaced conductors forming a type of conductor mesh to allow air to flow through the openings of the mesh.

In general, none, one or more insulated conductors may be disposed about portions of the exterior surface of the terminal structure 104 that have excess electric stress. In the embodiment of FIG. 2, a top insulated conductor 103 is disposed proximate the entire periphery of a top edge of the terminal structure 104, and a bottom insulated conductor 203 is disposed proximate the entire periphery of a bottom edge 272. A plurality of brackets may be coupled to the terminal structure 104 and the associated insulated conductors 103 and 203 to support the insulated conductors 103 and 203 proximate an exterior portion of the terminal structure.

The insulated conductors 103, 203 include an insulator with a dielectric strength greater than 75 kilovolts (kV)/inch disposed about a conductor. The insulated conductors 103, 203 may drop a high proportion of the terminal voltage within the insulated conductors 103, 203. Hence, the insulated conductors 103, 203 reduces the electric stress in the air gap 111 between the terminal structure 104 and the housing 112 and helps to promote a more uniform electric field within the air gap 111 compared to terminal structures with no such insulated conductors. In other words, the insulated conductor 103 may function as an electrical stress shield. Therefore, the terminal structure 104 may be energized to higher voltage levels within the same reasonably sized grounded housing 112.

Figure 3:
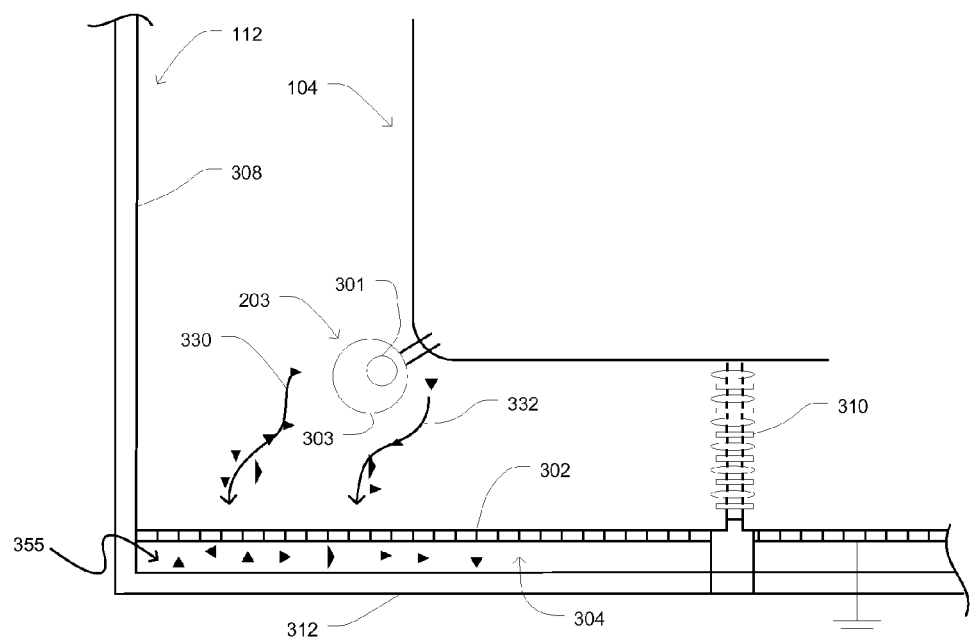
FIG. 3 is a partial cross sectional view taken along the line A-A of FIG. 2 illustrating a particle trap consistent with one embodiment.

Turning to FIG. 3, a partial cross sectional view taken along the line A-A of FIG. 2 illustrates a particle trap 304 consistent with one embodiment of the disclosure. The terminal structure 104 may be supported by insulator legs 310 to a floor 312 of the housing 112. A cross sectional view of the insulated conductor 203 of FIG. 2 is also illustrated having a conductor 301 surrounded by an insulator 303. A sidewall 308 and floor 312 of the housing 112 is also illustrated.

Advantageously, a conductive material having a plurality of openings, such as a conductive mesh, 302 is disposed a distance away from an interior surface of the housing, such as the floor 312, a sidewall 308 or the ceiling, to define a particle trap 304 between the conductive material 302 and the interior surface. In certain embodiment, the particle trap is created between the conductive material 302 and the floor 312. In the absence of electric fields, particles positioned proximate the terminal structure 104 tend to fall due to the force of gravity towards the conductive material 302 as illustrated by arrows 330, 332. The conductive material 302 has a plurality of openings sized to permit the passage of particles 324 therethrough. In one embodiment, the conductive material 302 is a mesh, which may be fabricated of ⅛ inch diameter wire spaced at ⅝ inch apart and may be positioned about a distance of 1.5 inches above the floor 312. The conductive mesh 302 may also be fabricated of materials that have sufficient mechanical strength such that personnel that enter the housing cavity 144 may walk on the conductive mesh 302 without damaging the same. Materials such as fencing may also be utilized. In other embodiments, a metal sheet of sufficient thickness and strength with a sufficient number of openings through which particles can pass may be used. In some embodiments, it is advantageous that the ratio of the surface area of the conductive material to the total area to be covered is as small as practical. In other words, the material should have as many openings as is practical to minimize the surfaces on which particles may rest. Although the term "conductive mesh" is used throughout this disclosure, any surface having a conductive material with a plurality of openings through which particles may pass may be used. Thus, the disclosure should not be limited to a specific embodiment. In the embodiment of FIG. 3, the conductive mesh 302 may be grounded. In this embodiment, the particle trap 304 defines an area of lower electric field strength so that particles 355 trapped therein tend to remain in the trap even when the terminal structure 104 is energized to high voltage levels.

Figure 4:
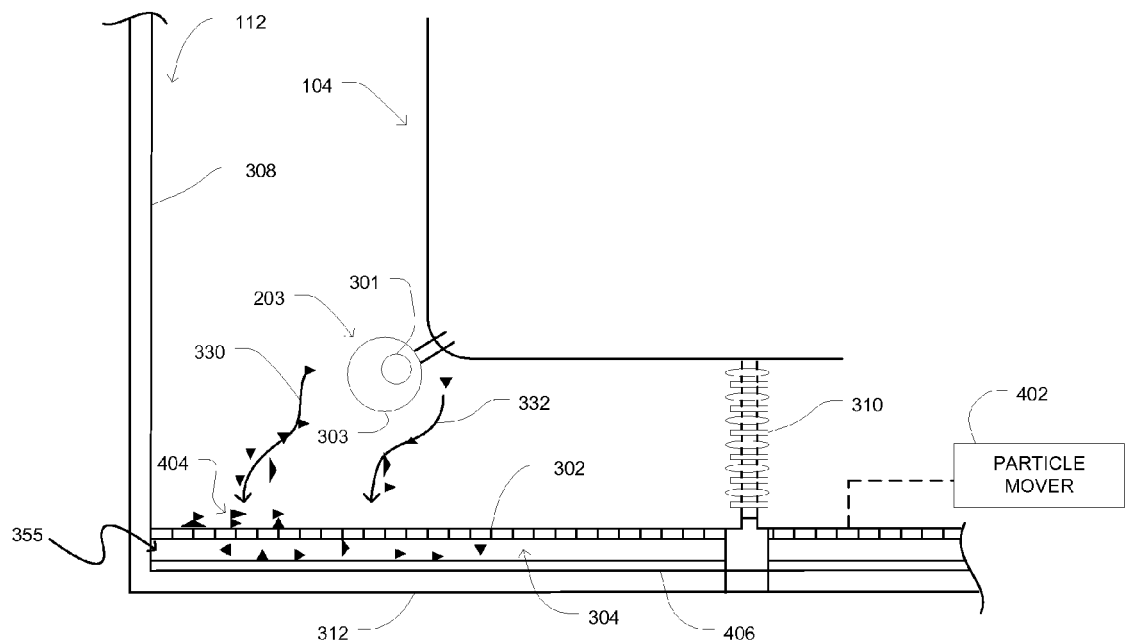
FIG. 4 is a partial cross sectional view of another embodiment of a particle trap having a particle mover.

Turning to FIG. 4, a partial cross sectional view of another embodiment of a particle trap 304 is illustrated. Compared to the embodiment of FIG. 3, the particle trap 304 has a particle mover 402 configured to urge particles towards a plurality of openings in the conductive mesh 302. In this way, any particles that are in the housing cavity or resting on a top surface of the conductive mesh 302 would tend to be urged towards and through the plurality of openings in the conductive mesh 302. An adhesive tape 406 may also be disposed on at least a portion of the floor 312 to assist in retaining particles in the trap. The adhesive tape 406 may include, but not be limited to, elastomers, polymers, or rubbers with a high particle sticking coefficient and a low outgas in vacuum. The adhesive tape 406 as well as the particle trap 304 may be cleaned during a preventative maintenance time. The adhesive tape 406 may also be replaced at other times during preventative maintenance. A disposable adhesive tape 406 can reduce the cleaning time for the particle trap 304. The adhesive can be applied in combinations of other figures shown within.

Figure 5:
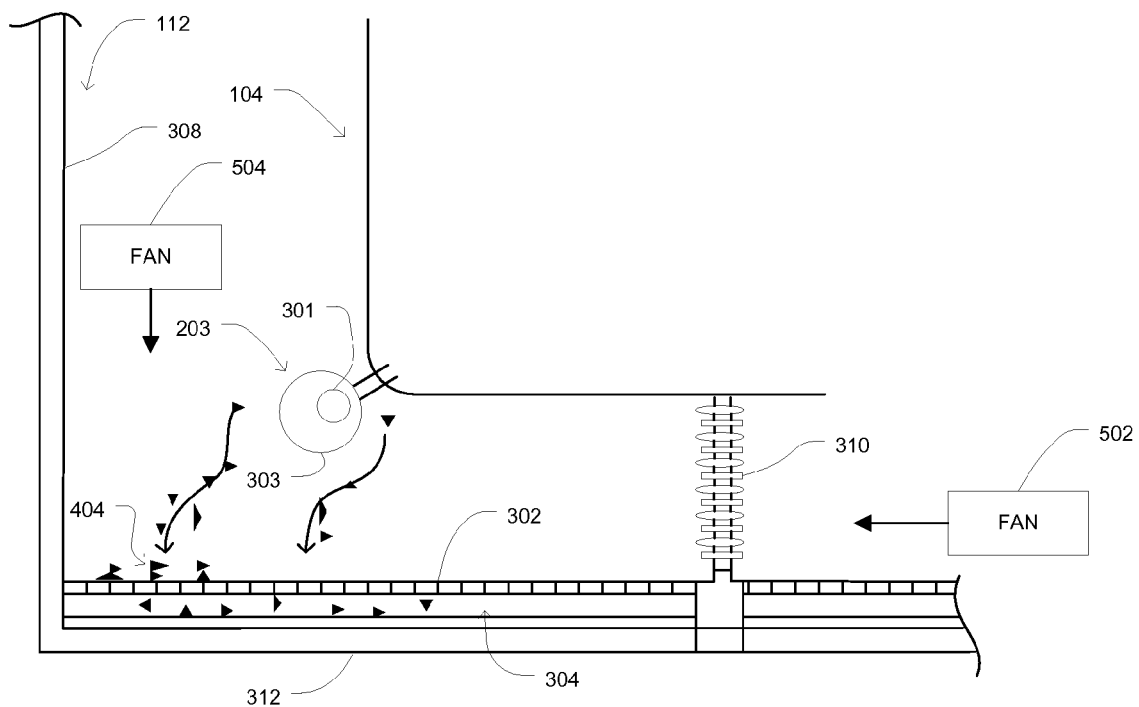
FIG. 5 is a partial cross sectional view of another embodiment consistent with FIG. 4 where the particle mover is a fan.

Turning to FIG. 5, a partial cross sectional view of another embodiment of a particle trap 304 consistent with FIG. 4 is illustrated where the particle mover 402 includes at least one fan 502, 504. The fans 502, 504 include a motor and a blade as is known in the art and are configured to blow particles towards the plurality of openings in the conductive mesh 302. Although two fans 502, 504 are illustrated, only one fan may be needed depending on differing parameters such as the area of the conductive mesh, and the strength of the fan. The fan 504 may be displaced in a vertical direction from the conductive mesh to urge particles substantially downward towards openings in the conductive mesh 302. The fan 502 may be positioned to urge particles across the conductive mesh 302 so that particles that positioned on a top surface of the conductive mesh 302 tend to fall into openings in the conductive mesh 302.

Figure 6:
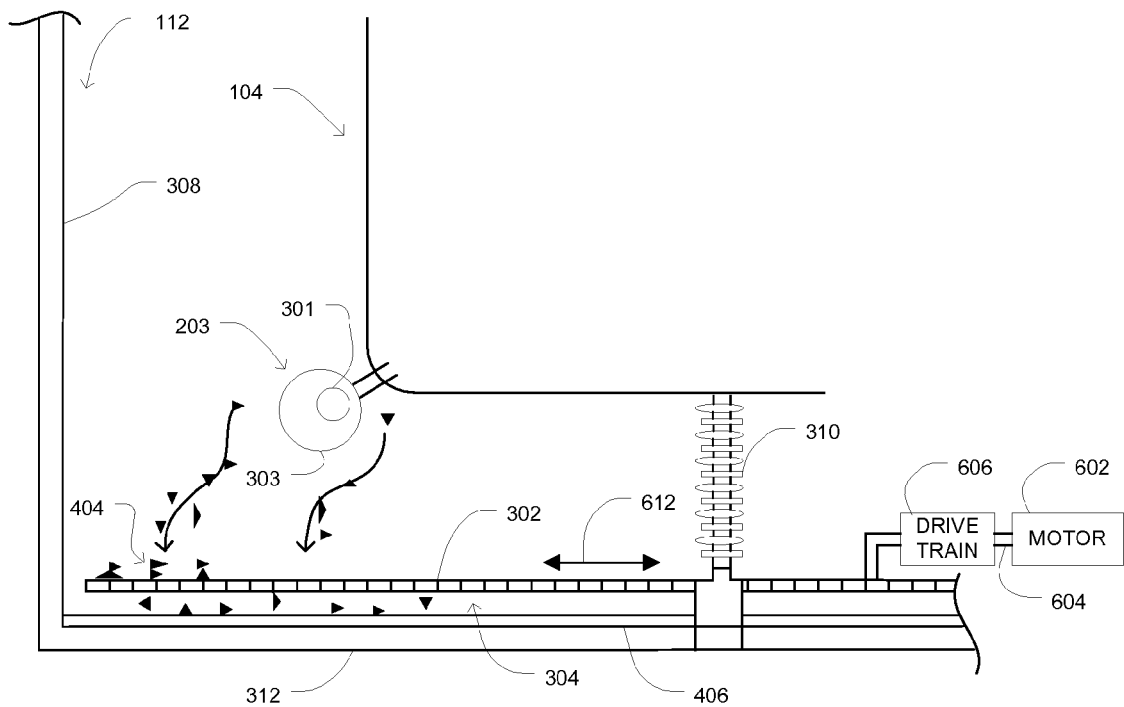
FIG. 6 is a partial cross sectional view of another embodiment consistent with FIG. 4 where the particle mover is a mechanical structure to vibrate a conductive mesh of the particle trap.

Turning to FIG. 6, a partial cross sectional view of another embodiment of a particle trap 304 consistent with FIG. 4 is illustrated where the particle mover 402 is a mechanical device coupled to the conductive mesh 302 to vibrate the conductive mesh, for example in the direction 612. In this way, particles that are positioned on a top surface of the conductive mesh 302 tend to fall into openings in the conductive mesh 302. The mechanical device may include a motor 602 having an output shaft 604 and a drive train 606 coupled to the output shaft 604 and the conductive mesh 302. The motor 602 is configured to drive the output shaft 604 and the drive train 606 to vibrate the conductive mesh 302. One or more fans 502, 504 of FIG. 5 may also be present to complement the mechanical vibration of the conductive mesh. Depending on the direction and distance of vibration of the conductive mesh 302, sufficient clearance between the conductive mesh 302 and surrounding surfaces such as a sidewall 308 of the housing 112 should be provided.

Figure 7:
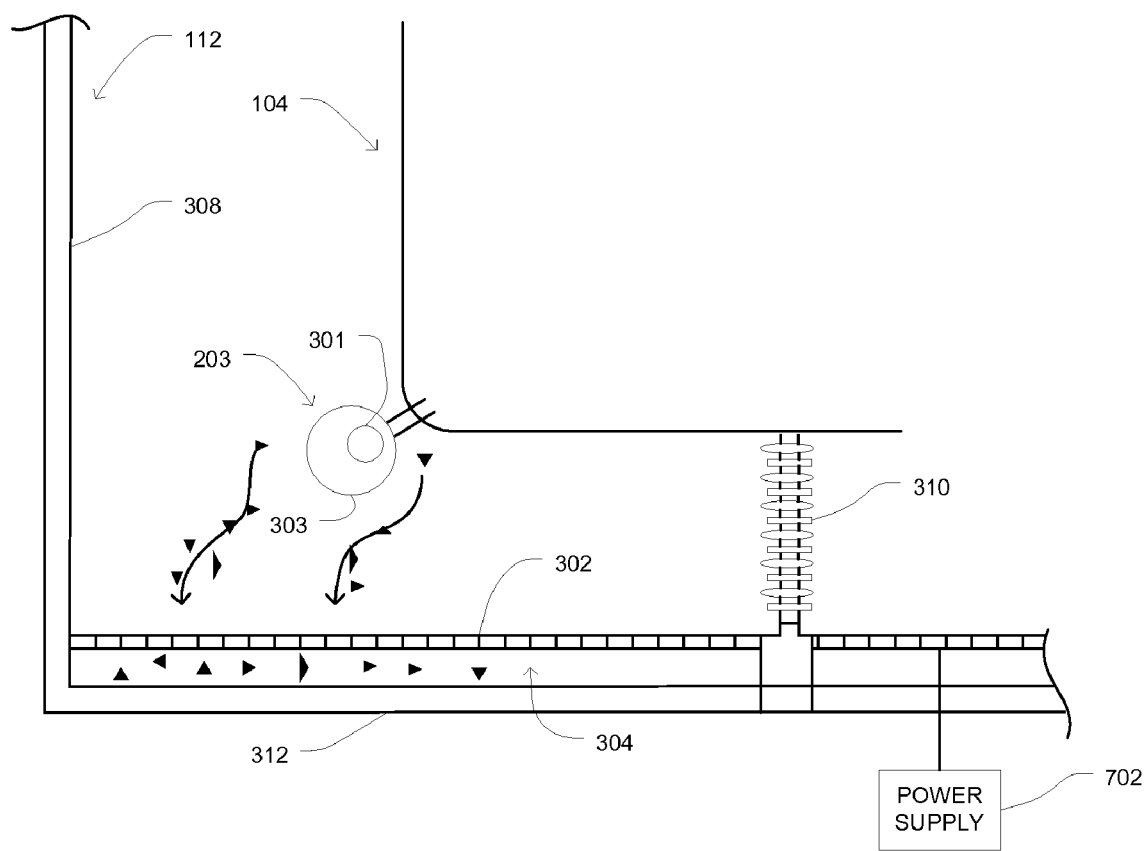
FIG. 7 is a partial cross sectional view of another embodiment of a particle trap having a power supply coupled to a conductive mesh of the particle trap.

FIG. 7 illustrates a partial cross sectional view of yet another embodiment of a particle trap consistent with the disclosure. As opposed to grounding the conductive mesh as previously detailed, the particle trap 304 of FIG. 7 includes a power source 702 electrically coupled to the conductive mesh 302 to energize the conductive mesh during certain time intervals as is further detailed with respect to FIG. 8.

Figure 8:
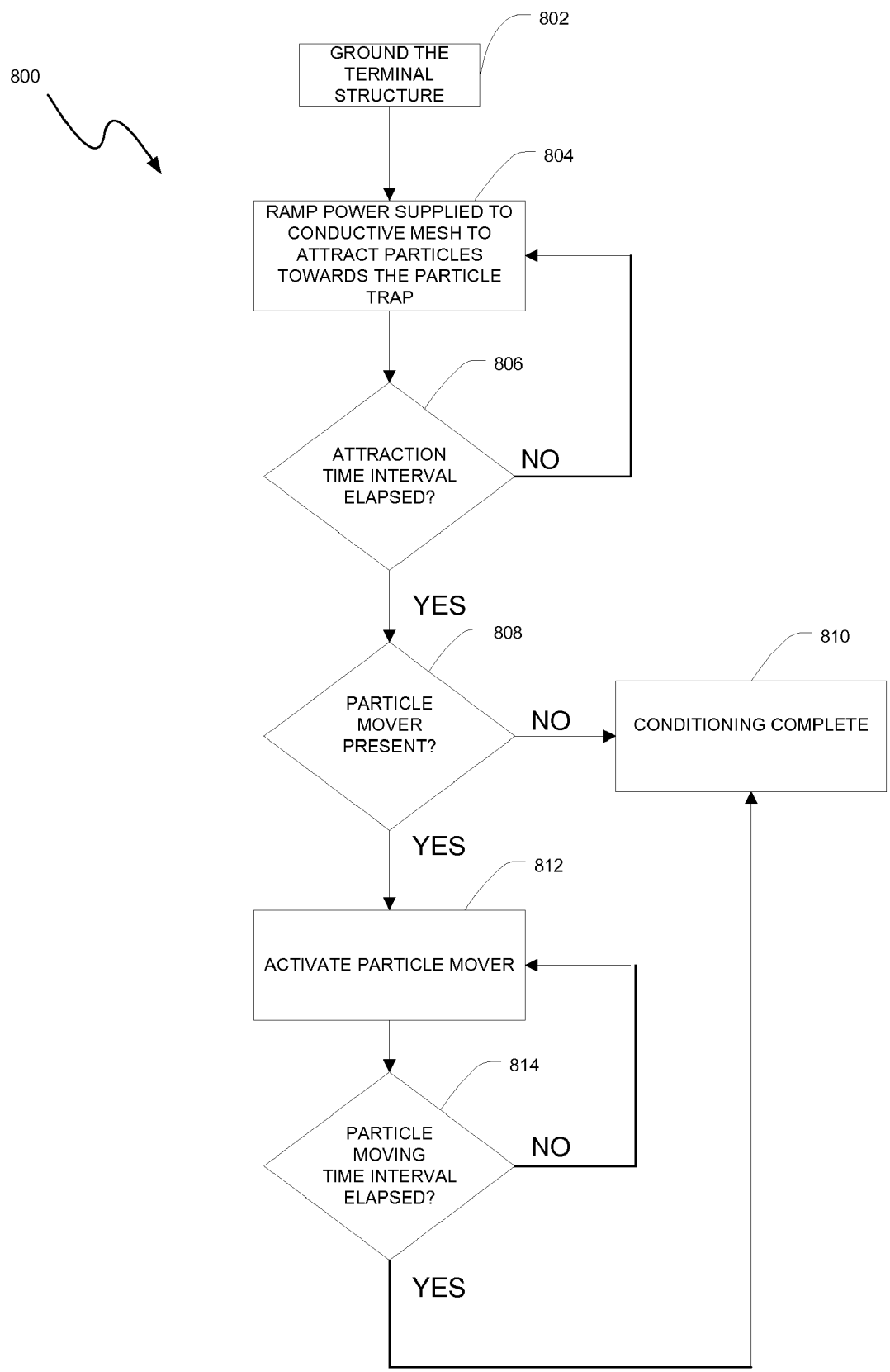
FIG. 8 is a flow chart of operations consistent with an embodiment of the disclosure.

Turning to FIG. 8, a flow chart 800 of operations consistent with an embodiment of the disclosure is illustrated. The operations 800 detail a conditioning process that may be utilized before operation of the ion implanter 100. The terminal structure of the ion implanter may be grounded 802. Power may then be supplied to the conductive mesh to attract particles towards the particle trap in operation 804. Such power may be supplied by the power supply 702 to the conductive mesh 302 as illustrated in FIG. 7. In some embodiments, the voltage applied to the conductive mesh may be about 100 kV. If an attraction time interval has not expired 806, power is continually supplied to the conductive mesh. In some embodiments, an attraction time of roughly 10-15 minutes is used to allow sufficient time to allow particles to migrate to the trap. Other attraction times and voltages are also within the scope of the disclosure. If the attraction time interval has expired, the conditioning process inquires if a particle mover is present 808. If a particle mover is not present, the conditioning cycle is complete and the ion implanter is free to operate. If a particle mover is present, the particle mover is activated 812. If the particle mover has not been activated for a desired particle moving time interval 814, then the process continues to operate the particle mover. If the particle mover has been activated for the desired moving time interval 814, then the conditioning cycle is complete and the ion implanter is free to operate. Alternatively, if a particle mover is present it may be activated at the same time that power is supplied to the conductive mesh.

While FIG. 8 assumes that the high voltage terminal is grounded during the conditioning process, this is not a requirement. Alternatively, the voltage applied to the conductive mesh can be much greater than that applied to the high voltage terminal. Both approaches will result in a electrostatic field within the housing wherein the more positive voltage is located near the trap.

Alternatively or additionally, other modifications can be made to further reduce the amount of particles in the high voltage environment. Combinations of the figures above can be utilized as systems within implanter 100.

As described above, during normal operation, the conductive mesh may be held at the same potential as the floor of the housing. However, in another embodiment, the enclosed region defined between the conductive mesh and the floor is not maintained at zero electrostatic field. Rather, a field is created which continues to attract particles already in the trap away from the mesh and toward the floor. This can be achieved by applying a negative voltage to the conductive mesh during normal operation. Alternatively, a positive voltage can be applied to the floor. In either case, the localized electrostatic field within the trap draws particles already in the trap toward to the bottom surface, thereby reducing the possibility that particles drift out of the trap, into the electrostatic field and toward the high voltage terminal. This additional field can be provided either by using the power supply 702 (as shown in FIG. 7), or by the use of an additional power supply.

In another embodiment, a particle trap is constructed on or near the ceiling of the housing 112. In certain embodiments, during the conditioning process, a positive voltage is applied to the ceiling, or to a conductive surface positioned proximate the ceiling. Particles within the housing are attracted toward the ceiling due to this applied electrostatic field. To retain these attracted particles, especially after the voltage has been removed, a sticky substance, such as an adhesive tape, may be applied to the ceiling or proximate surface. As described above, the adhesive tape may include, but not be limited to, elastomers, polymers, or rubbers with a high particle sticking coefficient and a low outgas in vacuum. The adhesive tape may be removed and replaced during preventative maintenance. Alternatively, a localized electrostatic filed within the particle trap can be used to draw the particles toward the ceiling. This ceiling-based particle trap can be used alone or in conjunction with the previously described floor-based particle trap. When used simultaneously, the conditioning process must be extended to allow each conductive surface to be independently charged. In other words, in the first part of the conditioning process, the upper mesh is energized to attract particles upward into the ceiling-based trap. After the upper ceiling-based trap has been energized for a sufficient amount of time, the upper mesh is deactivated, and the lower mesh is energized. Any remaining particles that were not captured by the ceiling-based trap are attracted downward and are retained in the particle trap below. The process illustrated in FIG. 8 is then completed and the implanter 100 is ready for normal operation. The conditioning process used for the ceiling-based trap may follow the steps outlined in FIG. 8.

Alternatively, or additionally, traps can be applied to the sidewalls of the housing 112. In other words, a particle trap may be disposed near any interior surface of the housing, where the expression "interior surface of the housing" includes the floor, the ceiling and the sidewalls. Particle traps located near the sidewalls may use adhesive trap as described above to retain the particles. Alternatively, a localized electrostatic field within the particle trap that draws particles toward the sidewall can be utilized.

Figure 9:
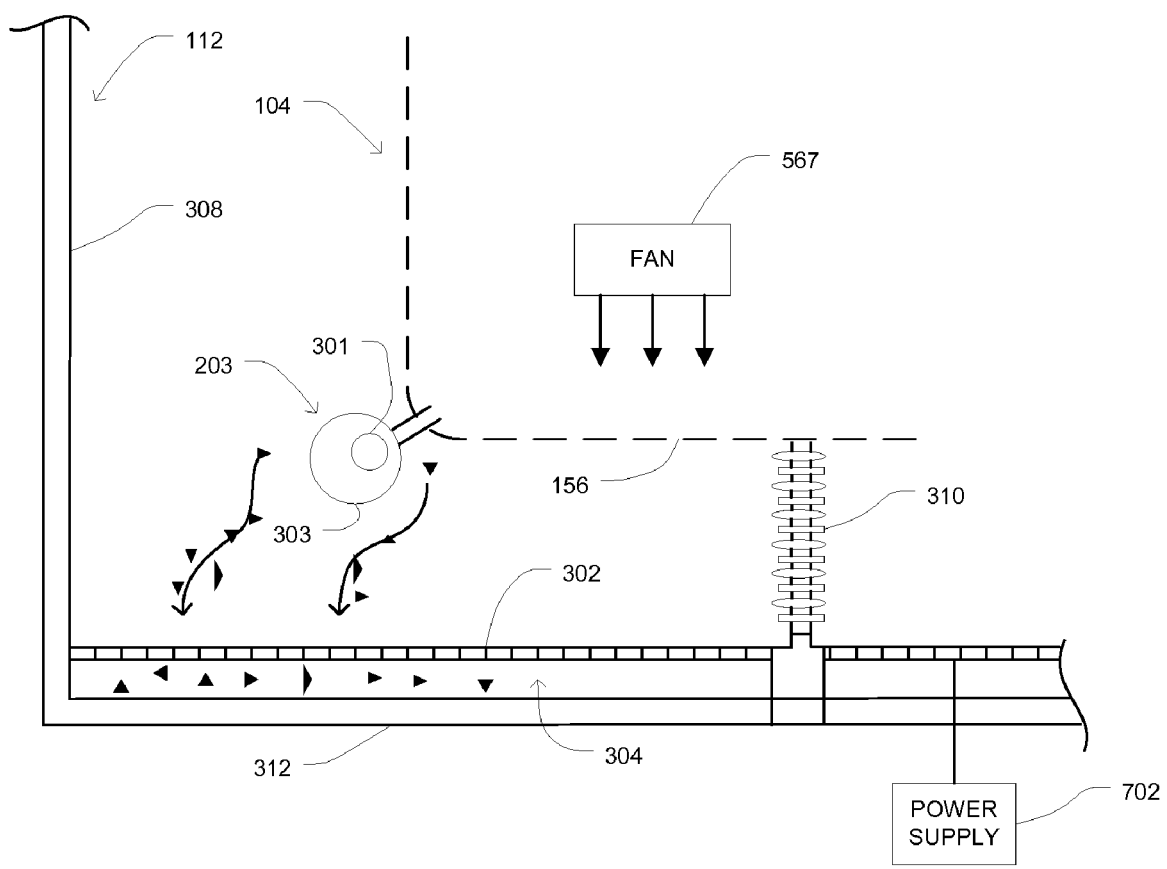
FIG. 9 is a partial cross sectional view of another embodiment in which the high voltage terminal has perforated surfaces.

In other embodiments, as shown in FIG. 9, the high voltage terminal 104 comprises one or more perforated surfaces 156. Perforated surfaces 156 have less surface area than solid surfaces, and therefore provide less surface area to which particles can attach. Such perforations also allow particles, such as those resting atop the high voltage terminal, to be drawn to the floor-based particle trap and pass into and/or through the high voltage terminal. Additionally, a particle mover 567, such as a fan, can be used to push particles away from the high voltage terminal 104, and preferably toward the particle trap 304, as illustrated by the arrows in FIG. 9. Alternatively, the particle mover 567 can draw particles into the structure 104, where no electrostatic field exists. Either scenario reduces the number of particles in contact with the outer surface of the terminal 104.

Figure 10:
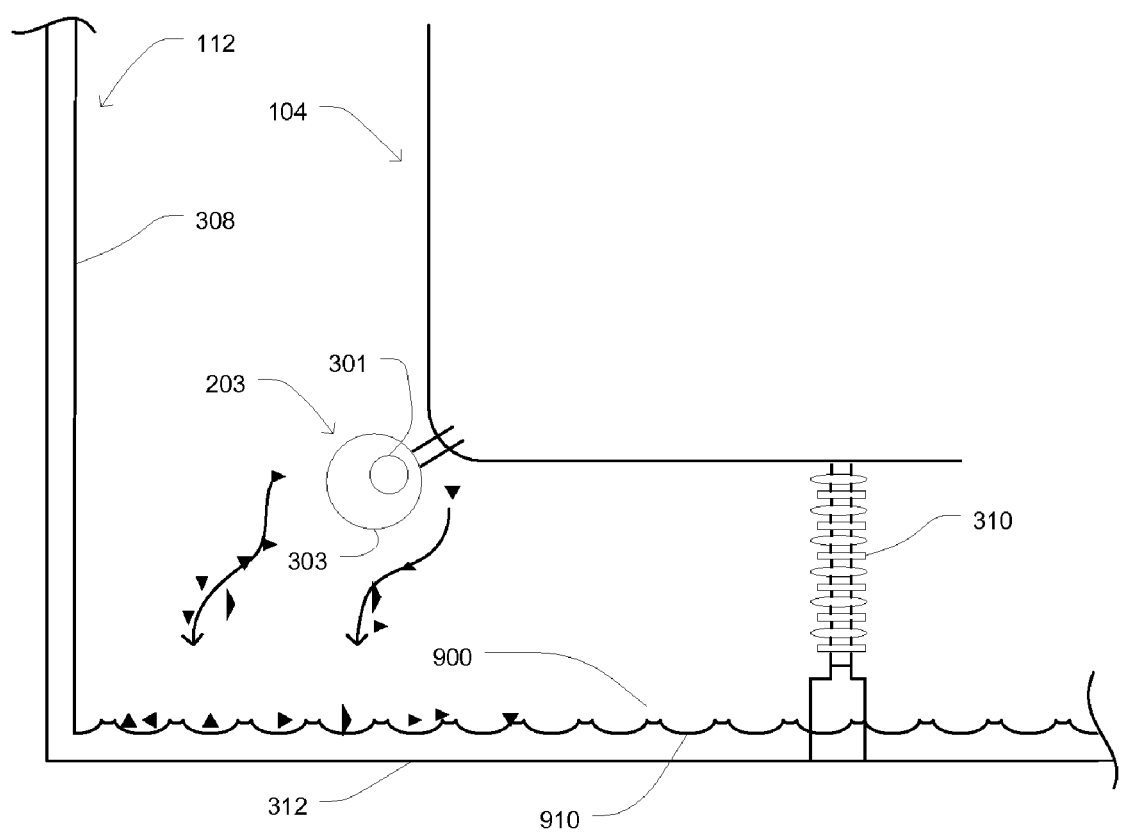
FIG. 10 is a partial cross sectional view of another embodiment in which the floor has dimples.

FIG. 10 shows a second embodiment of a floor-based trap. In this embodiment, the floor 900 contains a number of depressions or dimples 910. The surface irregularities affect the localized electrostatic field in that area. Specifically, the field in the depressions or dimples is at or near zero potential. Therefore, particles in those areas are not attracted toward the high voltage terminal. Thus, particles which fall into the depressions tend to remain in those depressions, even in the presence of an electrostatic field. In further embodiments, the conditioning process illustrated in FIG. 8 can be utilized with this floor. Additionally, particle movers, such as fans and devices that cause mechanical vibration of the floor, can be used in conjunction with this embodiment.

Accordingly, there is provided a particle trap for an ion implanter. The particle trap creates a region of low electric field so that particles present in the trap tend to remain in the trap. This improves reliability of high voltage performance of the ion implanter. A particle trap consistent with the disclosure is not limited to ion implanters and may also be used in other high voltage apparatus. For example, other equipment used in the processing of semiconductor materials which require a portion of the machine to be at high voltages may make use of this trap.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes.

What is claimed is:

1. A semiconductor processing machine comprising: a terminal structure, operable to be energized to a terminal voltage containing an ion source;
   a grounded housing defining a housing cavity, said terminal structure disposed within said housing cavity;
   a conductive material having a plurality of openings disposed a distance away from an interior surface of said housing to define a particle trap between said conductive material and said interior surface to collect particles in said particle trap; and
   a power supply electrically coupled to said conductive material, said power supply configured to apply a voltage to said conductive material during a conditioning time interval that is greater than the voltage applied to the terminal so as to attract particles toward said conductive material and into said trap.

2. The semiconductor processing machine of claim 1, wherein said conductive material comprises a mesh.

3. The semiconductor processing machine of claim 1, wherein said interior surface comprises the floor of said housing.

4. The semiconductor processing machine of claim 1, further comprising a particle mover configured to urge particles towards said plurality of openings in said conductive material.

5. The semiconductor processing machine of claim 4, wherein said particle mover comprises a fan configured to blow particles towards said plurality of openings in said conductive material.

6. The semiconductor processing machine of claim 4, wherein said particle mover comprises:
   a motor having an output shaft, and
   a drive train coupled to said output shaft and said conductive material, wherein said motor is configured to drive said output shaft and said drive train to vibrate said conductive material to urge particles towards said plurality of openings in said conductive material.

7. The semiconductor processing machine of claim 1, wherein an adhesive tape is disposed on said interior surface to further secure particles in said particle trap.

8. The semiconductor processing machine of claim 1, wherein said conductive material is grounded.

9. The semiconductor processing machine of claim 1, wherein said conditioning time interval occurs prior to energizing said terminal structure to said terminal voltage.

10. An apparatus comprising:
    a terminal structure;
    a conductive material having a plurality of openings disposed a distance away from an interior surface of a grounded housing to define a particle trap between said conductive material and said interior surface to collect particles in said particle trap; and
    a power supply electrically coupled to said conductive material configured to apply a voltage to said conductive material during a conditioning time interval that is greater than the voltage applied to the terminal structure so as to attract particles toward said particle trap.

11. The apparatus of claim 10, wherein said power supply is configured to bias said conductive material so as to attract particles toward said interior surface and retain particles within said particle trap.

12. The apparatus of claim 10, further comprising a particle mover configured to urge particles towards said plurality of openings in said conductive material.

13. The apparatus of claim 12, wherein said particle mover comprises a fan configured to blow particles towards said plurality of openings in said conductive material.

14. The apparatus of claim 10, wherein an adhesive tape is disposed on the surface to further secure particles in the particle trap.

15. A method for reducing particles within a grounded housing having a high voltage terminal, said high voltage terminal comprising an ion source, comprising:
    locating said high voltage terminal within said grounded housing;
    positioning a conductive material having a plurality of openings a distance away from an interior surface of said grounded housing to define a particle trap between said conductive material and said interior surface to collect particles in said particle trap;
    electrically coupling a power supply to said conductive material; and
    applying a voltage to said conductive material during a conditioning time interval that is greater than the voltage applied to the high voltage terminal so as to attract particles toward said conductive material and into said trap.

16. The method of claim 15, further comprising grounding said ion source and said high voltage terminal during said conditioning time interval.

17. The method of claim 15, further comprising providing a particle mover within said housing and actuating said particle mover to urge particles into said particle trap.

18. The method of claim 17, wherein said particle mover is actuated after said voltage is applied to said conductive material.

19. The method of claim 17, wherein said particle mover is actuated while said voltage is applied to said conductive material.

20. The method of claim 15, further comprising applying a negative voltage to said conductive material so as to retain particles in said particle trap.

21. The method of claim 16, further comprising applying a voltage to said ion source and said high voltage terminal after said conditioning time interval.

22. The method of claim 21, further comprising applying a second voltage to said conducting material after applying a voltage to said ion source.

23. The method of claim 22, wherein said second voltage is ground.

24. The method of claim 22, wherein said second voltage is a negative voltage to retain said particles in said trap.

* * * * *